(12) United States Patent
Ball

(10) Patent No.: US 9,568,535 B2
(45) Date of Patent: Feb. 14, 2017

(54) METHODS FOR DETECTING AN OPEN CURRENT TRANSFORMER

(71) Applicant: ABB RESEARCH LTD, Zurich (CH)

(72) Inventor: Roy Ball, Andover, ME (US)

(73) Assignee: ABB Research Ltd., Zurich (CH)

( * ) Notice: Subject to any disclaimer, the term of this patent is extended or adjusted under 35 U.S.C. 154(b) by 115 days.

(21) Appl. No.: 14/354,936

(22) PCT Filed: Oct. 31, 2012

(86) PCT No.: PCT/US2012/062653
§ 371 (c)(1),
(2) Date: Apr. 29, 2014

(87) PCT Pub. No.: WO2013/066914
PCT Pub. Date: May 10, 2013

(65) Prior Publication Data
US 2014/0306716 A1 Oct. 16, 2014

Related U.S. Application Data

(60) Provisional application No. 61/555,591, filed on Nov. 4, 2011.

(51) Int. Cl.
*G01R 31/02* (2006.01)
*H02H 3/52* (2006.01)
(Continued)

(52) U.S. Cl.
CPC .............. *G01R 31/027* (2013.01); *H02H 3/52* (2013.01); *H02H 7/042* (2013.01); *G01R 15/18* (2013.01); *G01R 31/026* (2013.01); *H02H 3/044* (2013.01)

(58) Field of Classification Search
CPC ..... G01R 31/02; G01R 31/027; G01R 31/045; G01R 21/133; G01R 31/11; G01R 31/008; G01R 31/021; G01R 31/36; G01R 31/3627; G01R 19/2513; G01R 31/343; G01R 31/3631; H02H 7/125
(Continued)

(56) References Cited

U.S. PATENT DOCUMENTS 4,638,710 A * 1/1987 Kitamura ............. G10H 1/0575
84/607
5,508,623 A * 4/1996 Heydt .................... G01R 23/20
307/105
(Continued)

FOREIGN PATENT DOCUMENTS

WO    WO 2009/047748 A2    4/2009    ............... H02H 9/04

OTHER PUBLICATIONS

International Search Report mailed Jun. 11, 2013 in corresponding application PCT/US2012/062653.
(Continued)

*Primary Examiner* — Vinh Nguyen
*Assistant Examiner* — Alvaro Fortich
(74) *Attorney, Agent, or Firm* — Taft Stettinius & Hollister LLP

(57) ABSTRACT

A method for detecting an open current transformer in an electrical power system includes measuring for a voltage value on a secondary side of a current transformer. The method continues with observing the voltage value for a predetermined waveform and initiating corrective action in the electrical power system upon detection of the predetermined waveform.

6 Claims, 3 Drawing Sheets

(51) Int. Cl.
   *H02H 7/04*   (2006.01)
   *H02H 3/04*   (2006.01)
   *G01R 15/18*  (2006.01)

(58) Field of Classification Search
   USPC ....... 324/547, 546, 537, 500, 555, 600, 726,
              324/76.11, 126, 127, 239, 241, 522, 713;
              361/35, 38, 93.5, 93.6, 268, 269
   See application file for complete search history.

(56) References Cited

U.S. PATENT DOCUMENTS

| | | | | |
|---|---|---|---|---|
| 5,539,651 A * | 7/1996 | Zabar | ........................ | H02J 3/01 324/623 |
| 5,909,656 A * | 6/1999 | Yang | ........................ | G06F 17/14 324/522 |
| 6,278,357 B1 * | 8/2001 | Croushore | ............... | H04B 3/54 340/534 |
| 6,654,713 B1 * | 11/2003 | Rethman | ................. | H03M 7/30 703/14 |
| 7,212,930 B2 * | 5/2007 | Bruno | ................... | G01R 25/08 324/76.11 |
| 2004/0183544 A1 * | 9/2004 | Allan | ..................... | G01R 31/11 324/533 |
| 2004/0260794 A1 * | 12/2004 | Ferentz | ................... | G06F 1/266 709/220 |
| 2005/0201033 A1 | 9/2005 | Song | ........................... | 361/93.5 |
| 2006/0067095 A1 * | 3/2006 | Hou | .......................... | H02J 3/24 363/78 |
| 2009/0243398 A1 * | 10/2009 | Yohanan | ............... | H02J 3/1842 307/105 |
| 2010/0001698 A1 * | 1/2010 | Johnson | ................ | H02J 3/1864 323/209 |
| 2010/0039737 A1 * | 2/2010 | Koshizuka | ............ | H02H 9/002 361/36 |
| 2010/0296220 A1 * | 11/2010 | Seon | ........................ | H02H 3/33 361/115 |

OTHER PUBLICATIONS

Written Opinion mailed Jun. 11, 2013 in corresponding application No. PCT/US2012/062653.

* cited by examiner

METHODS FOR DETECTING AN OPEN CURRENT TRANSFORMER

CROSS-REFERENCE TO RELATED APPLICATION

This is a §371 application of International patent application number PCT/US2012/062653 filed Oct. 31, 2012, which claims the benefit of U.S. provisional patent application Ser. No. 61/555,591 filed on Nov. 4, 2011, both of which are incorporated herein by reference.

TECHNICAL FIELD

The present invention is generally related to methods for detecting unplanned openings of a current transformer. Specifically, the present invention is directed to utilizing on-line testing to determine the status of a current transformer and to allow for responsive or corrective action upon detection of an open current transformer.

BACKGROUND ART

Protective relays are devices designed to protect an electrical power system during disturbances. To accomplish their functions, the relays receive signals from the power system mainly by way of two types of devices, the potential transformer and the current transformer.

Potential transformers convert high voltage levels down to low voltage levels. Current transformers convert high current levels to low current levels. The lower level currents are then received by devices like protective relays and demand meters.

It is well known that current transformers have a unique operating characteristic. If the current transformer is operating under load—with current flowing in the primary side—and the low level's secondary side circuit is open, then high voltages will develop at the current transformer secondary terminals which can be dangerous or fatal to operators and may damage devices connected to the current transformer's circuits. Additionally, an open transformer circuit results in a disconnuity of signal provided to the protection and control equipment, such as the protective relays, causing likely misoperations or failure to operate. Moreover, an open circuit associated with a current transformer can result in magnetization of the current transformer that causes incorrect output even after the open circuit condition is corrected. In robust power systems, the current transformer is considered to be a weak link since there are not many ways to understand the overall health of the device other than off-line testing.

The prior art provides over voltage protection against the unplanned opening of current transformers by utilizing a test plug and meter. This is accomplished by continuous monitoring of the voltage levels on the secondary side of the transformer. If an over voltage condition develops, an electronic component that is placed in parallel with the main current path detects the condition. In response to the over voltage condition, the electronic component switches on, bypassing the open circuit and returning the current flow and eliminating the over voltage condition. Accordingly, the prior art device has the ability to limit the voltage to safer levels of under 100 volts.

However, this approach is still not considered to provide adequate safety protection. Accordingly, other devices have been developed that analyze the current flow. For example, when the alternating current flow crosses a zero value, the prior art electronic switching device turns off, eliminating the bypass of the open circuit and the current continues to flow in the primary (high side) of the current transformer. With a secondary side of the transformer open circuited, an over voltage condition again develops across the secondary and the protection on the test plug once again limits the voltage to safer levels and the cycle continues to repeat until the test plug is removed from the circuit. Thus, until the test plug is removed from the circuit, the user of the test plug is continuously exposed to voltages that may exceed desired safety levels. Unfortunately, the monitoring of the on and off cycles causes a lack of continuity of current to the protective relays and also negatively impacts the integrity of the current waveform as that waveform is distorted in the secondary side of the current transformer. This lack of either continuity or integrity in the secondary circuit could be seen by some protective relays as a disturbance in the electrical power system, thereby causing protective relays to take the power system out of service unnecessarily.

Another prior art solution provides for a test switch connected between the transformer's secondary side and a protective device. A plug for testing the circuit is inserted into the test switch so that the secondary side current flows through the test plug wherein the test plug comprises a circuit for closing the current transformer secondary side when the secondary side is open circuited and closing the circuit when closed, thereby maintaining a continuous flow of current through the protective device. Although this test plug configuration is an improvement, it is believed that a further improvement can be obtained by directly monitoring the voltage and/or current conditions of the secondary side of the current transformer thus allowing for the ability to instantaneously correct or generate an alarm when an open circuit condition is detected.

SUMMARY OF INVENTION

In light of the foregoing, it is a first aspect of the present invention to provide methods for detecting an open current transformer.

It is another aspect of the present invention to provide a method for detecting an open current transformer in an electrical power system, comprising measuring for a voltage value on a secondary side of a current transformer, observing the voltage value for a predetermined waveform, and initiating corrective action in the electrical power system upon detecting the predetermined waveform.

Yet another aspect of the present invention is to provide a method for detecting an open current transformer in an electrical power system, comprising measuring for a current value on a secondary side of a current transformer, checking a status of a component in the electrical power system, and indicating a status of the current transformer as pen or no load if the current value is zero and the component is off.

BRIEF DESCRIPTION OF THE DRAWINGS

This and other features and advantages of the present invention will become better understood with regard to the following description, appended claims, and accompanying drawings wherein:

BEST MODE FOR CARRYING OUT THE INVENTION

Figure 1:
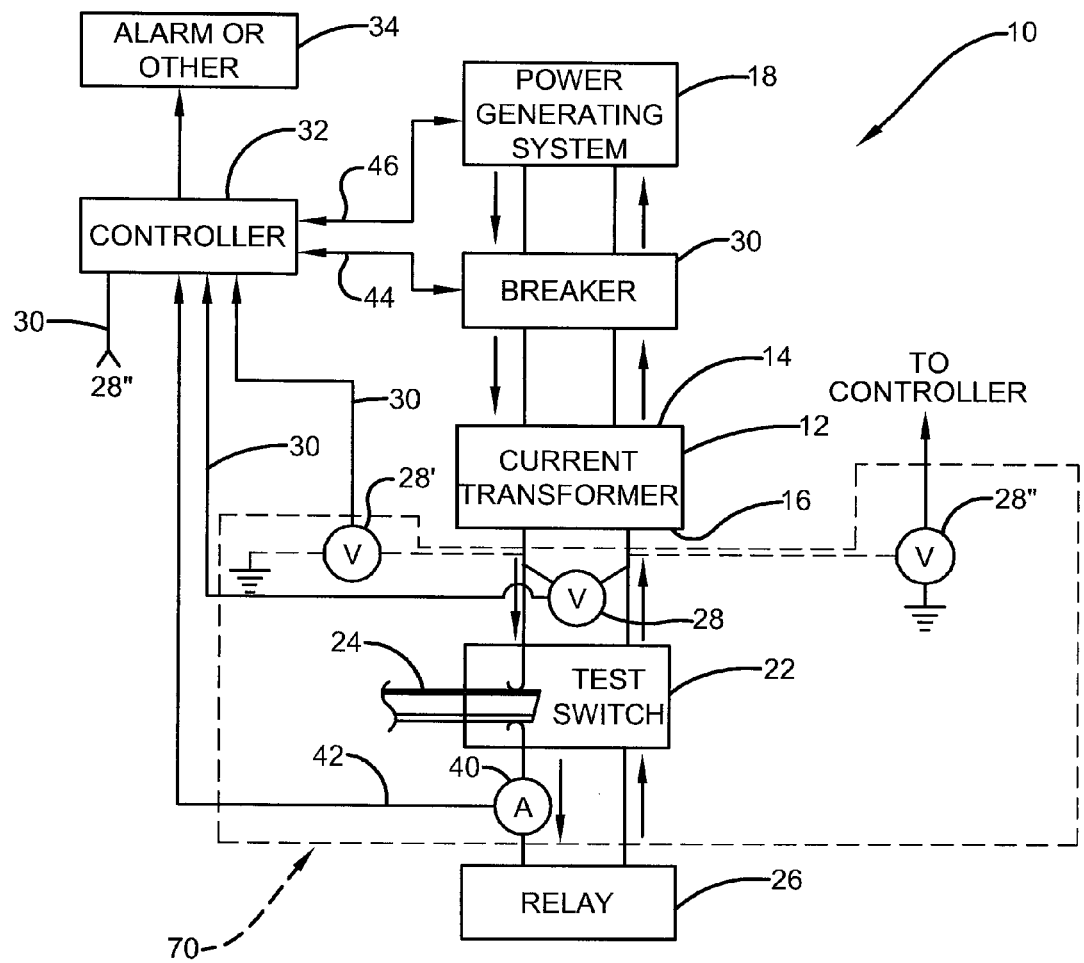
FIG. 1 shows an exemplary circuit associated with a current transformer.

Referring now to FIG. 1, it can be seen that a circuit for detecting an open current transformer is designated generally by the numeral 10. The circuit 10 includes a current transformer 12 which has a primary side 14 and a secondary side 16. The primary side 14 is connected to a power generating system 18 and a breaker 20 as shown. Skilled artisans will appreciate that other components may be connected between the power generating system and the current transformer. Connected on the secondary side of the current transformer 12 may be a test switch 22 which receives a test plug 24 as is known in the art. The test plug 24 is insertable so as to monitor the condition of the current transformer if required. Also connected to the secondary side of the current transformer is a relay 26 which may be in the form of any protective device utilized by the circuit 10. Of course, other components could be incorporated into the relay as required by a particular use of the circuit 10.

A voltmeter 28 is connected to and across the circuit path of the secondary side 16 of the current transformer. The voltmeter 28 generates a voltmeter signal 30 that is supplied to a controller 32. In one alternative embodiment, an additional voltmeter 28' is connected between one leg of the current transformer on the secondary side 16 and ground. This allows detection of an open current transformer everywhere in the current transformer circuit except between the meter connection point and the current transformer. It is believed that placement of the voltmeter 28' as close as possible to the current transformer 12 improves the ability to detect open circuit conditions. In another alternative embodiment, another voltmeter 28" is connected between the other leg of the current transformer on the secondary side 16 and ground. As in the first embodiment, the voltmeter signal 30 from both voltmeters 28' and 28" are sent to the controller 32. It will be appreciated that each voltmeter 28' and 28" can be used separately and independently from the other as each location with respect to the current transformer has specific benefits. However, skilled artisans will appreciate that using both voltmeters 28' and 28" allows for full detection should an open condition occur anywhere in the circuit.

An alarm or other corrective action device 34 is also connected to the controller. The controller 32 may be any processing or computing device which provides the necessary hardware, software, memory and/or other component needed to implement operation of the circuit 10 and the methods described herein. In any event, the voltage at the voltmeter, which may be at any arbitrary point on the secondary side, is taken to an external reference point, typically ground. It should further be noted that the current transformer does not need to be grounded for the methods to be described herein to operate properly.

An ammeter 40 is also connected anywhere in the circuit path of the secondary side of the current transformer. The ammeter 40 generates a signal 42 that is received by the controller 32. The controller 32 also may receive a breaker status signal 44 generated by the breaker and/or a power system status signal 46 generated by the power generating system 18. As will be appreciated, the ammeter 40 monitors the characteristics of the current flowing through the circuit 10 connected to the secondary side 16 of the current transformer.

Figure 2:
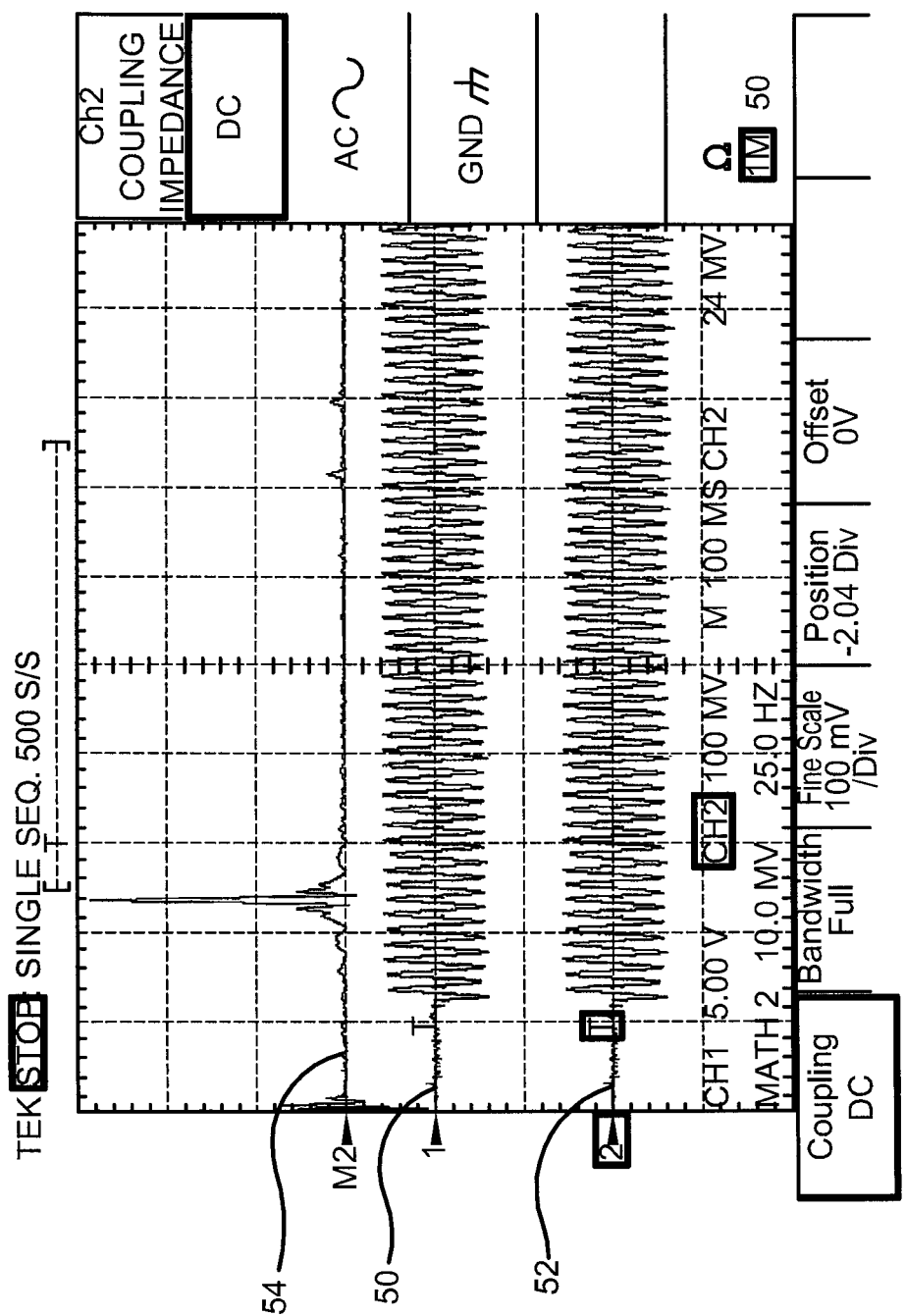
FIG. 2 shows exemplary voltage and current waveforms during normal operation of the current transformer.

Referring now to FIG. 2, the normal operation of the secondary side of the current transformer 12 is graphically illustrated. A waveform 50 represents the current signal 42 detected by the ammeter 40 during normal operation. A waveform 52 develops and represents the voltage signal 30 that is detected by any one of the voltmeters 28, 28', and/or 28". These waveforms 50, 52 are received by the controller 32 and it or another related instrument performs a Fast Fourier Transform on the voltage signal which is shown as a waveform 54. As can been seen, the waveform 54 shows includes only a fundamental component with little or no related harmonics.

Figure 3:
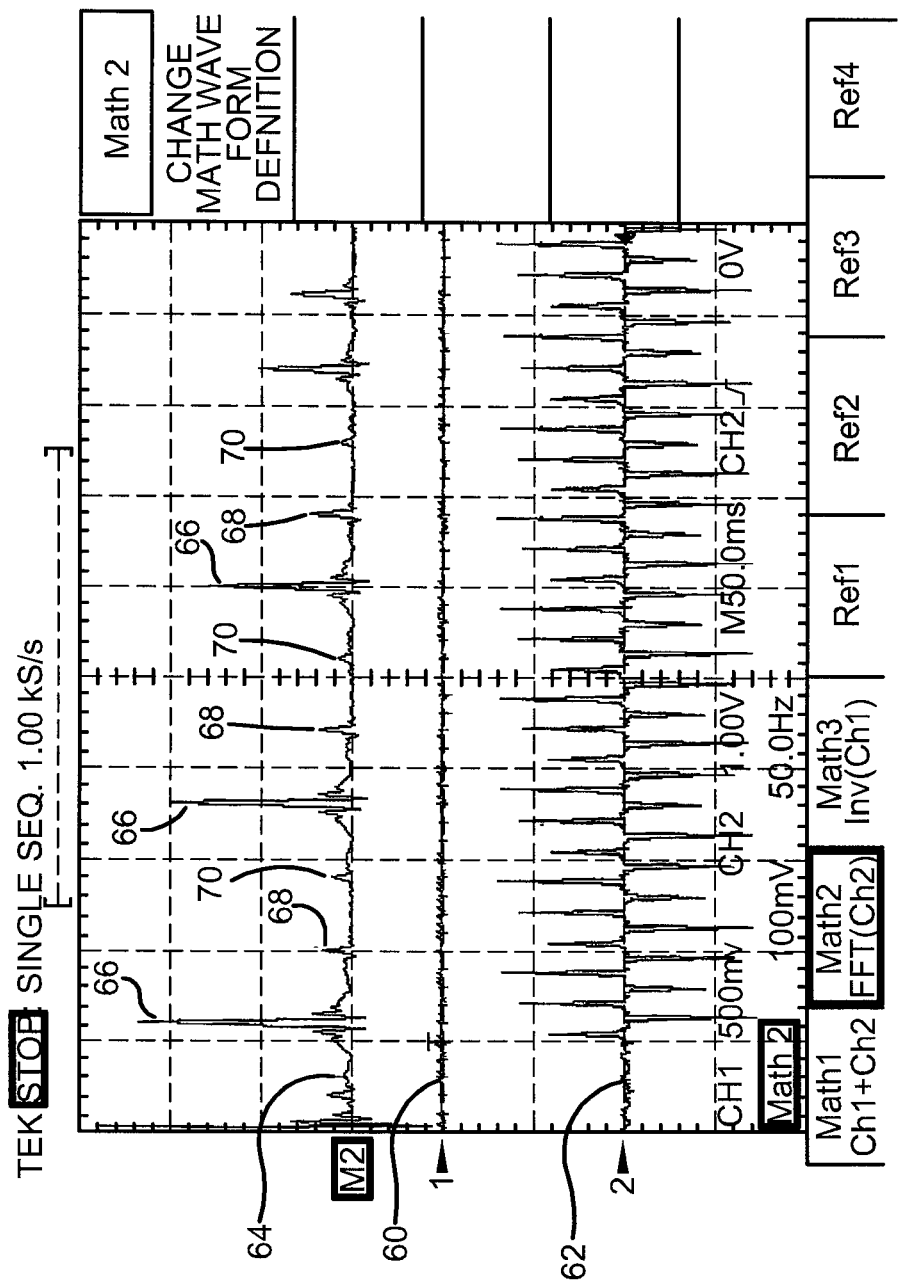
FIG. 3 shows exemplary voltage and current waveforms during an open circuit operation of the current transformer according to the concepts of the present invention.

Referring now to FIG. 3, the signal detected by the voltmeter and ammeter are represented as waveforms during an open current transformer condition. In particular, the current, as represented by a waveform 60, goes to a zero value so as to represent that there is no current flow through the secondary side of the current transformer. As a result, a voltage, as shown in a waveform 62, develops showing a saturated transformer core. Thus, the voltage signal 30, as detected by the voltmeter 28 and represented by the waveform 62, is received by the controller 32 which performs a Fast Fourier Transform analysis and generates a waveform 64 showing a decaying harmonic rich waveform. Specifically, the fast Fourier transformer shows a high content of third and fifth harmonics. It is believed that this signature is true for all types of current transformers in an open circuit condition of a current transformer. For some non-linear loads or a few transient conditions, the harmonic content on the voltage waveform signal may approach similar harmonic content. When this signature, as represented in waveform 62, is detected in conjunction with the absence of current, such as shown in the waveform 60, then an open current transformer condition is present. It is believed that the fast Fourier transform signature is consistent among different types of current transformers used in the industry. Indeed, such a signature is consistent among different types of current transformers, including accuracy, class and applications. It will further be appreciated that the fundamental harmonics 66 are larger than the third harmonics 68, and that the third harmonics 68 are larger than the fifth harmonics 70. This kind of signature is not present during normal operation and can be utilized to confirm an open current transformer condition so that the controller 32 may generate an alarm 34 or so that other corrective action can be taken in either the power system, the breaker or other component on the primary side of the current transformer. Accordingly, in some instances the first detection of a fundamental, fifth and third harmonic may be used to immediately implement corrective action.

In operation, the circuit 10 provides a method for detecting an open current transformer in an electrical power system by first measuring a voltage value on a secondary side of a current transformer. The controller observes the voltage value as embodied in the voltmeter signal 30 for a predetermined waveform. A predetermined waveform as shown in FIG. 3, which provides fundamental third and fifth harmonics of continually decreasing values, can be used as a trigger for taking corrective action. Of course, other selected characteristics of a voltmeter signal 30 which are known to be representative of an open current transformer may also be maintained by the controller for comparison purposes. In any event, once a predetermined waveform is detected by the controller, the controller initiates corrective action(s) in a component of the circuit 10 such as the power generating system 18 or the breaker 20. The controller 32 may observe characteristics of the predetermined waveform wherein any decaying harmonic waveform may be required to be seen before initiating corrective action. Furthermore, the controller may require that the waveform include third and fifth harmonics before initiating corrective action. In the alternative, the controller may initiate corrective action only if the decaying harmonic waveform is detected and no current is detected in the secondary side of the current transformer.

In an alternative embodiment, the controller may look just at the current value generated by the ammeter 40 as represented by the signal 42. By monitoring a current value on the secondary side of the current transformer, the controller can then also check for the status of a component in the electrical power system. The controller can then indicate a status of the current transformer as open or "no load" if the current value is zero and the status of the selective component is determined to be in an off condition. This embodiment may also initiate corrective action at the electrical power generating system upon detecting that the current values equal to zero and that the component is on.

It will be appreciated that in another embodiment one meter, any of the above-described meters, or all of the meters and associated logic calculation capabilities can be incorporated into a single test switch 70 shown in FIG. 1. This consolidates all the test components into a single switch, thereby facilitating analysis of any current transformer 14.

Based upon the foregoing, the advantages of the present invention are readily apparent. By utilizing the voltmeter and/or ammeter in the circuit path of the secondary side of the current transformer, an open current transformer condition can be readily detected without interfering with operation of the overall power system. Once an open circuit current transformer condition is detected, an appropriate corrective action can be taken by either initiating an alarm or shutting down the system so as to prevent undesirable operating conditions from occurring.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. A method for detecting an open current transformer in an electrical power system, comprising:
    measuring for a voltage on a secondary side of a current transformer;
    observing said voltage for a predetermined waveform;
    detecting a signature of said predetermined waveform in said observed voltage, said signature of said predetermined waveform showing a decaying harmonic waveform; and
    initiating corrective action in the electrical power system upon detecting said signature of said predetermined waveform in said observed voltage.

2. The method according to claim 1, further comprising:
    observing whether said decaying harmonic waveform of said signature includes third and fifth harmonics before initiating corrective action.

3. The method according to claim 1, further comprising:
    initiating corrective action only if said decaying harmonic waveform is detected and no current is detected in said secondary side of said current transformer.

4. The method according to claim 1, further comprising:
    measuring for said voltage between at least one leg of said current transformer and ground.

5. The method according to claim 2, further comprising:
    applying a Fast Fourier Transform analysis to said observed voltage to generate a waveform for comparison to said predetermined waveform.

6. The method according to claim 5, further comprising:
    initiating corrective action upon first detection of a fundamental, third and fifth harmonic of said observed voltage.

* * * * *